(12) United States Patent
Xu et al.

(10) Patent No.: US 12,260,911 B2
(45) Date of Patent: Mar. 25, 2025

(54) MEMORY CIRCUIT STRUCTURE AND METHOD OF OPERATING MEMORY CIRCUIT STRUCTURE

(71) Applicant: INSTITUTE OF MICROELECTRONICS, CHINESE ACADEMY OF SCIENCES, Beijing (CN)

(72) Inventors: Xiaoxin Xu, Beijing (CN); Jie Yu, Beijing (CN); Danian Dong, Beijing (CN); Zhaoan Yu, Beijing (CN); Hangbing Lv, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 270 days.

(21) Appl. No.: 18/247,213

(22) PCT Filed: Jan. 25, 2021

(86) PCT No.: PCT/CN2021/073533
§ 371 (c)(1),
(2) Date: Mar. 29, 2023

(87) PCT Pub. No.: WO2022/068125
PCT Pub. Date: Apr. 7, 2022

(65) Prior Publication Data
US 2023/0368838 A1 Nov. 16, 2023

(30) Foreign Application Priority Data

Sep. 30, 2020 (CN) .......................... 202011069953.5

(51) Int. Cl.
*G11C 13/00* (2006.01)

(52) U.S. Cl.
CPC ...... *G11C 13/0069* (2013.01); *G11C 13/0023* (2013.01); *G11C 13/0064* (2013.01); *G11C 2013/0066* (2013.01)

(58) Field of Classification Search
CPC ............ G11C 13/0069; G11C 13/0023; G11C 13/0064; G11C 2013/0066;
(Continued)

(56) References Cited

U.S. PATENT DOCUMENTS

2019/0279714 A1 9/2019 Fackenthal et al.

FOREIGN PATENT DOCUMENTS

| CN | 101882462 A | 11/2010 |
|---|---|---|
| CN | 104240757 A | 12/2014 |
| CN | 105719691 A | 6/2016 |

OTHER PUBLICATIONS

International Search Report and Written Opinion dated Jul. 8, 2021, for corresponding PCT Application No. PCT/CN2021/073533.

*Primary Examiner* — Jerome Leboeuf
(74) *Attorney, Agent, or Firm* — Kinney & Lange, P.A.

(57) ABSTRACT

The memory circuit structure includes: a storage array, wherein the storage array includes at least two storage units; a decoder connected with a bit line and a word line of the storage array respectively; a programming circuit configured to generate a voltage pulse or a constant current pulse; a polarity switching circuit connected with the programming circuit, and configured to implement a switching between a voltage programming and a current programming of the programming circuit under a set operation and a reset operation; a detection circuit connected with the storage array, and configured to detect a detection signal of a current or a voltage corresponding to the specific storage unit in the storage array and feed back the detection signal to a control unit, wherein the detection signal output by the detection (Continued)

circuit is configured to enable the polarity switching circuit to switch; and the control unit.

10 Claims, 5 Drawing Sheets

(58) Field of Classification Search
CPC ........ G11C 13/0007; G11C 2013/0073; G11C 2013/0078; G11C 2013/009; G11C 2213/82; G11C 13/0026; G11C 13/0097; G11C 2213/79
See application file for complete search history.

MEMORY CIRCUIT STRUCTURE AND METHOD OF OPERATING MEMORY CIRCUIT STRUCTURE

CROSS REFERENCE TO RELATED APPLICATION

This application is a Section 371 National Stage Application of International Application No. PCT/CN2021/073533, filed on Jan. 25, 2021, entitled "MEMORY CIRCUIT STRUCTURE AND METHOD OF OPERATING MEMORY CIRCUIT STRUCTURE", which is incorporated herein by reference in its entirety which claims priority to Chinese Application No. 202011069953.5, filed on Sep. 30, 2020, incorporated herein by reference in their entirety.

TECHNICAL FIELD

The present disclosure belongs to a field of storage technology, and relates to a memory circuit structure and a method of operating a memory circuit structure.

BACKGROUND

As a new type of memory, resistive random access memory (RRAM) has many advantages. In terms of process, the resistive random access memory is fully compatible with the current mature CMOS process, simple to prepare, and highly integrated. In terms of programming operation, the resistive random access memory has advantages of low working voltage, fast response speed and low power consumption. At the same time, the resistive memory may be used in brain-like, neural network, neuron and other applications due to a diversity of resistive states.

In a storage array, programming parameters of devices are discrete, and the existing programming solution will cause some devices in the storage array to be over-programmed or under-programmed, which may reduce a cycling capacity of the devices in the storage array and increase a bit error rate of the storage array. Improving the retention characteristics and endurance of the devices and reducing the bit error rate of the storage array are problems that required to be solved when the resistive memory is applied.

SUMMARY

In view of the above, the present disclosure provides a memory circuit structure and a method of operating a memory circuit structure to improve the endurance and retention characteristics of the resistive memory, improve the uniformity of the resistive states, and reduce the bit error rate of the array.

An aspect of the present disclosure provides a memory circuit structure. The memory circuit structure described above includes: a storage array, wherein the storage array includes at least two storage units; a decoder connected with a bit line and a word line of the storage array respectively, and configured to select a specific storage unit of a specific row and a specific column for operation; a programming circuit configured to generate a voltage pulse or a constant current pulse; a polarity switching circuit connected with the programming circuit, and configured to implement a switching between a voltage programming and a current programming of the programming circuit under a set operation and a reset operation; a detection circuit connected with the storage array and configured to detect a detection signal of a current or a voltage corresponding to the specific storage unit in the storage array and feed back the detection signal to a control unit, wherein the detection signal output by the detection circuit is configured to enable the polarity switching circuit to switch; and the control unit configured to, according to the detection signal, control the polarity switching circuit to perform a switching operation and control a pulse output of the programming circuit.

According to embodiments of the present disclosure, under the set operation, the programming circuit is configured to generate the voltage pulse, and a first path of the polarity switching circuit is turned on, so that the programming circuit implements the voltage programming along the first path; in a voltage programming stage, the detection circuit is configured to detect whether a first current flowing through the specific storage unit exceeds a first preset value; if the first current exceeds the first preset value, the control unit is configured to control the polarity switching circuit to switch from the first path to a second path, and cause the programming circuit to output the constant current pulse to implement the current programming along the second path; in a current programming stage, the detection circuit is configured to detect whether a first voltage on the specific storage unit exceeds a second preset value; if the first voltage exceeds the second preset value, the control unit is configured to control the programming circuit to stop output.

According to embodiments of the present disclosure, under the reset operation, the programming circuit is configured to generate the constant current pulse, and a second path of the polarity switching circuit is turned on, so that the programming circuit implements the current programming along the second path; in a current programming stage, the detection circuit is configured to detect whether a second voltage flowing through the specific storage unit is less than a third preset value; if the second voltage is less than the third preset value, the control unit is configured to control the polarity switching circuit to switch from the second path to a first path, and cause the programming circuit to output the voltage pulse to implement the voltage programming along the first path; in a voltage programming stage, the detection circuit is configured to detect whether a second current on the specific storage unit is less than a fourth preset value; and if the second current is less than the fourth preset value, the control unit is configured to control the programming circuit to stop output.

According to embodiments of the present disclosure, the polarity switching circuit includes two groups of selection transistors in parallel; each group of selection transistors includes at least two selection transistors in series; the two groups of selection transistors are respectively a first group of selection transistors and a second group of selection transistors; an on-off of the first group of selection transistors is controlled by a first selection signal output by the control unit; and an on-off of the second group of selection transistors is controlled by a second selection signal output by the control unit; wherein the first selection signal is configured to control the first group of selection transistors to turn on while the second selection signal is configured to control the second group of selection transistors to turn off, or the first selection signal is configured to control the first group of selection transistors to turn off while the second selection signal is configured to control the second group of selection transistors to turn on. The polarity switching circuit controls the operation modes of writing and erasing the device through control signals Sel_b and Sel of a gating tube. In the first selection signal Sel_b and the second selection signal Sel, Sel_b is an inversion signal of Sel signal, that is, in the circuit, Sel=1, Sel_b=0; or, Sel=0, Sel_b=1.

According to embodiments of the present disclosure, when the first selection signal (Sel_b) is configured to control the first group of selection transistors to turn on, and the second selection signal (Sel) is configured to control the second group of selection transistors to turn off, a first path of the polarity switching circuit is turned on, so that the programming circuit implements the voltage programming along the first path; and when the first selection signal is configured to control the first group of selection transistors to turn off, and the second selection signal is configured to control the second group of selection transistors to turn on, a second path of the polarity switching circuit is turned on, and the second path is different from the first path, so that the programming circuit implements the current programming along the second path. In an embodiment, when Sel_b=1 and Sel=0, the first path of the polarity switching circuit is turned-on, so that the programming circuit may implement the voltage programming along the first path. When Sel_b=0 and Sel=1, the second path of the polarity switching circuit is turned-on.

According to embodiments of the present disclosure, the detection circuit described above includes: a first transistor, wherein an on-off of the first transistor is controlled by a first selection signal output by the control unit, and one end of the first transistor is used as an input end of the detection circuit; a first comparator, wherein a negative input end of the first comparator is connected with another end of the first transistor, and a positive input end of the first comparator is configured to input the detection signal of the voltage corresponding to the specific storage unit; a second transistor, wherein an on-off of the second transistor is controlled by a second selection signal output by the control unit, and one end of the second transistor is connected with the storage array; a second comparator, wherein an positive input end of the second comparator is connected with the other end of the second transistor, a negative input end of the second comparator is configured to input a reference voltage, and the negative input end of the first comparator is connected with the positive input end of the second comparator; and a logic gate, wherein two input ends of the logic gate are respectively connected with an output end of the first comparator and an output end of the second comparator, and an output of the logic gate is the detection signal.

According to embodiments of the present disclosure, the memory circuit structure described above further includes a current supply and management circuit. The current supply and management circuit described above includes a current mirror circuit, and the current mirror circuit includes two output ends, wherein one of the two output ends of the current mirror circuit is connected with an input end of the polarity switching circuit, and the other one of the two output ends of the current mirror circuit is connected with the input end of the detection circuit.

According to embodiments of the present disclosure, the memory circuit structure described above further includes a bias circuit connected with the programming circuit, wherein the control unit is configured to output an enabling signal to make the bias circuit generate an analog voltage signal, and the analog voltage signal is output to the programming circuit.

According to embodiments of the present disclosure, the storage unit described above is a resistive memory.

Another aspect of the present disclosure provides a method of operating the memory circuit structure described above. The operation described above is a set operation or a reset operation. The method described above includes: selecting, by a decoder, a specific storage unit in a specific row and a specific column of a storage array for operation, under the set operation or the reset operation; detecting, by a detection circuit, a detection signal of a current or a voltage corresponding to the specific storage unit in the storage array, and feeding back, by the detection circuit, the detection signal to a control unit; controlling, by a controller, a polarity switching circuit to perform a switching operation and a pulse output of a programming circuit according to the detection signal; and generating, by the programming circuit, a voltage pulse or a constant current pulse under an action of the controller, and implementing, by the programming circuit, first voltage programming and then current programming under the set operation or first current programming and then voltage programming under the reset operation, under the switching operation of the polarity switching circuit.

DETAILED DESCRIPTION OF EMBODIMENTS

The structure of the resistive random access memory (RRAM) is generally a stacked structure, including: a resistive material layer, and electrode layers located above and below the resistive material layer. Under an excitation of pulse voltage with different polarity, the resistance state of the resistive memory is different. For example, when a set operating voltage is applied, the oxygen ion in the device moves towards an oxygen storage layer of an upper electrode layer, thus forming an oxygen vacancy conductive filament in the RRAM, and the RRAM is in a low resistance state. When a reset operation voltage is applied, the oxygen ion and the oxygen vacancy are compounded, the conductive filament breaks, and the RRAM is in a high resistance state.

In a process of realizing the present disclosure, it is found that: when a formation of a filament is unstable or there are residual oxygen ions in a gap region of a broken filament, the retention characteristics and stability of the resistive device will deteriorate. In view of the above, the present disclosure proposes a memory circuit structure and a method of operating the same, which may stabilize the formation of the conductive filament by means of the coordinated work of voltage programming and current programming, or reduce the existence of residual oxygen ions as much as possible in the gap region of the broken filament or remove residual oxygen ions in the gap region by means of the coordinated work of current programming and voltage programming, so as to improve the retention characteristics and cyclic endurance of the resistive device under the set operation and the reset operation.

In the memory circuit structure and the method of operating the same provided in the present disclosure, the control unit may control, according to the detection signal of the detection unit, the polarity switching circuit to perform a switching operation and control the pulse output of the programming circuit, so that the programming circuit may implement a switching between the voltage programming and the current programming during the set or reset operation, so as to implement the coordinated work of the voltage programming and the constant current programming during the set or reset operation, so as to optimize the endurance and retention characteristics of the resistive memory, improve the uniformity of the resistive states, and reduce the bit error rate of the array. Therefore, the performance of the resistive memory may be effectively maintained in a plurality of read and write periods/cycles.

In order to make objectives, technical solutions and advantages of the present disclosure more apparent and understandable, the present disclosure is further described in detail below in combination with specific embodiments and with reference to the accompanying drawings.

In a first exemplary embodiment of the present disclosure, there is provided a memory circuit structure.

Figure 1:
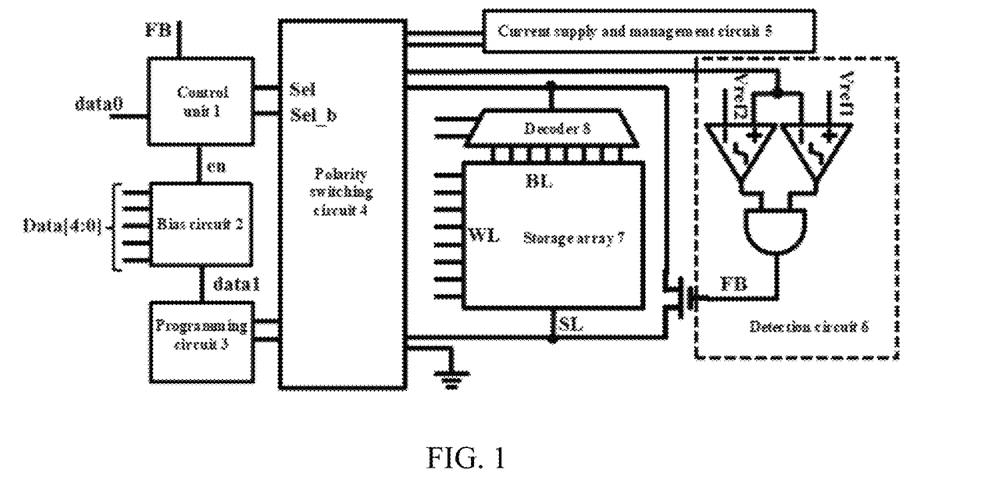
FIG. 1 shows a structural block diagram of a memory circuit structure according to an embodiment of the present disclosure.

FIG. 1 shows a structural block diagram of a memory circuit structure according to an embodiment of the present disclosure.

As shown in FIG. 1, the memory circuit structure according to the embodiment of the present disclosure includes: a storage array 7, a decoder 8, a programming circuit (also called a write circuit) 3, a polarity switching circuit 4, a detection circuit 6, and a control unit (also called an arbiter) 1.

According to embodiments of the present disclosure, the storage array 7 includes at least two storage units, and the storage units described above are resistive memories. Certainly, other types of storage units conforming to the technical concept of the present disclosure are also within the scope of protection of the present disclosure.

The decoder 8 is connected with a bit line BL and a word line WL of the storage array 7 respectively, and is used to select a specific storage unit in a specific row and a specific column for operation. The programming circuit 3 is used to generate a voltage pulse or a constant current pulse. The polarity switching circuit 4 is connected with the programming circuit 3 to implement a switching between a voltage programming and a current programming of the programming circuit 3 under a set operation and a reset operation. The detection circuit 6 is connected with the storage array 7, and is used to detect a detection signal FB of a current or a voltage corresponding to the specific storage unit in the storage array 7, and feed back the detection signal FB to the control unit 1. The detection signal FB output by the detection circuit 6 is used to enable the polarity switching circuit 4 to switch. The control unit 1 is used to, according to the detection signal FB, control the polarity switching circuit 4 to perform a switching operation and control a pulse output of the programming circuit 3.

Figure 2:
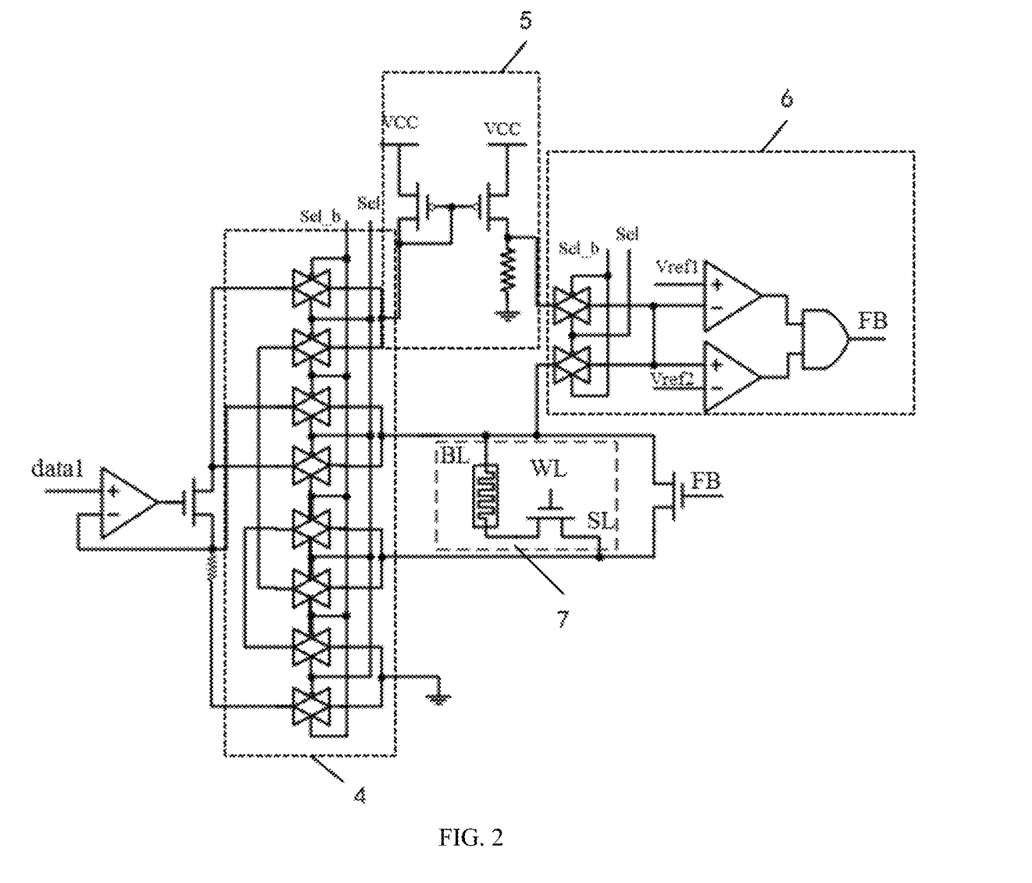
FIG. 2 shows a circuit structure diagram of a partial structure of a memory circuit structure according to an embodiment of the present disclosure.

FIG. 2 shows a circuit structure diagram of a partial structure of a memory circuit structure according to an embodiment of the present disclosure.

According to embodiments of the present disclosure, as shown in FIG. 2, the polarity switching circuit 4 includes two groups of parallel selection transistors, each group of selection transistors includes at least two selection transistors in series, and FIG. 2 takes each group of selection transistors including four selection transistors in series as an example, and the present disclosure is not limited to this.

For convenience of description, a first selection signal Sel_b and a second selection signal Sel are used to divide gating tubes into two groups. The two groups of selection transistors are respectively described as a first group of selection transistors and a second group of selection transistors. The first group of selection transistors is shown in FIG. 2 as first, third, fifth and seventh selection transistors arranged from top to bottom. The second group of selection transistors is shown in FIG. 2 as second, fourth, sixth and eighth selection transistors arranged from top to bottom. In combination with FIG. 1 and FIG. 2, the first selection signal Sel_b is an inversion signal of the second selection signal Sel; an on-off of the first group of selection transistors is controlled by the first selection signal Sel_b output by the control unit 1; an on-off of the second group of selection transistors is controlled by the second selection signal Sel output by the control unit 1; that is, the first selection signal controls the first group of selection transistors to turn on while the second selection signal controls the second group of selection transistors to turn off, or the first selection signal controls the first group of selection transistors to turn off while the second selection signal controls the second group of selection transistors to turn on.

According to embodiments of the present disclosure, as shown in FIG. 2, the detection circuit 6 described above includes a first transistor, a first comparator, a second transistor, a second comparator, and a logic gate. An on-off of the first transistor is controlled by the first selection signal Sel_b output by the control unit 1. One end of the first transistor is used as an input end of the detection circuit 6. A negative input end of the first comparator is connected with the other end of the first transistor, and a positive input end of the first comparator is used to input the detection signal of the voltage corresponding to the specific storage unit, which is described here as $V_{ref1}$. An on-off of the second transistor is controlled by the second selection signal Sel output by the control unit 1, and one end of the second transistor is connected with the storage array. An positive input end of the second comparator is connected with the other end of the second transistor, a negative input end of the second comparator is used to input a reference voltage, which is described here as $V_{ref2}$. The negative input end of the first comparator is connected with the positive input end of the second comparator. The two input ends of the logic gate are respectively connected with an output end of the first comparator and an output end of the second comparator, and an output of the logic gate is the detection signal. In the embodiment, the logic gate is an AND gate. The two inputs of the AND gate are respectively connected to the output of the first comparator and the output of the second comparator. The output of the AND gate is the detection signal FB.

According to embodiments of the present disclosure, as shown in FIG. 2, the memory circuit structure described above further includes: a current supply and management circuit 5. The current supply and management circuit 5 includes a current mirror circuit, and the current mirror circuit includes two output ends. One of the two output ends of the current mirror circuit is connected with an input end of the polarity switching circuit 4, and the other of the two output ends of the current mirror circuit is connected with the input end of the detection circuit 6.

As shown in FIG. 2, the current mirror circuit includes two transistors, which are described as a third transistor and a fourth transistor respectively. A source electrode of the third transistor is connected to a power supply voltage VCC (analog signal power supply voltage), and a drain electrode of the third transistor, as one of the two output ends of the current mirror circuit, is connected to the input end of the polarity switching circuit 4. The gate electrode of the third transistor and the drain electrode of the third transistor are short-circuited. The gate electrode of the third transistor is connected with the gate electrode of the fourth transistor, the source electrode of the fourth transistor is connected with the power supply voltage VCC (analog signal power supply voltage), and the drain electrode of the fourth transistor, as the other output end of the two output ends of the current mirror circuit, is connected with the input end of the detection circuit 6. The drain electrode of the fourth transistor is also connected with one end of a resistor, and the other end of the resistor is grounded.

According to embodiments of the present disclosure, as shown in FIG. 1, the memory circuit structure described above further includes: a bias circuit 2 connected with the programming circuit 3. The control unit 1 outputs an enabling signal en to make the bias circuit generate an analog voltage signal data1, and the above-mentioned analog voltage signal data1 is output to the programming circuit 3. As shown in FIG. 1, a digital voltage signal data0 input by the control unit 1 and the detection signal FB fed back by the detection circuit 6 are further illustrated. The control unit 1 outputs the first selection signal Sel_b, the second selection signal Sel and the enabling signal en according to the above-mentioned detection signal FB. In an example, a digital input signal Data [4:0] of bias circuit 2 is a 5-bit digital signal. The bias circuit 2 generates the analog signal data1 and outputs the analog voltage signal data1 to the programming circuit 3.

Figure 3:
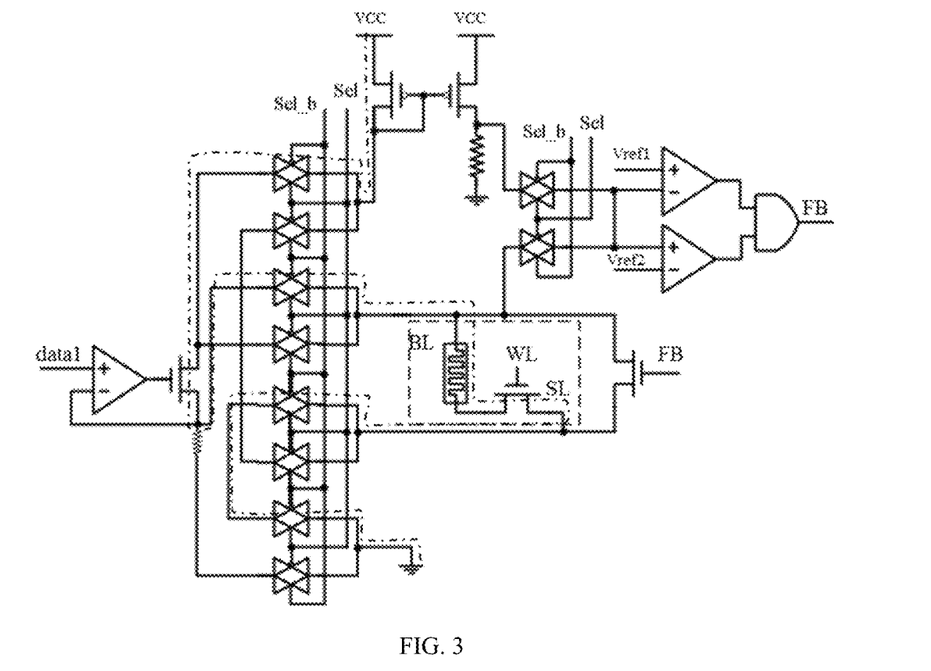
FIG. 3 shows a first path diagram of voltage programming of a memory circuit structure according to an embodiment of the present disclosure.
Figure 4:
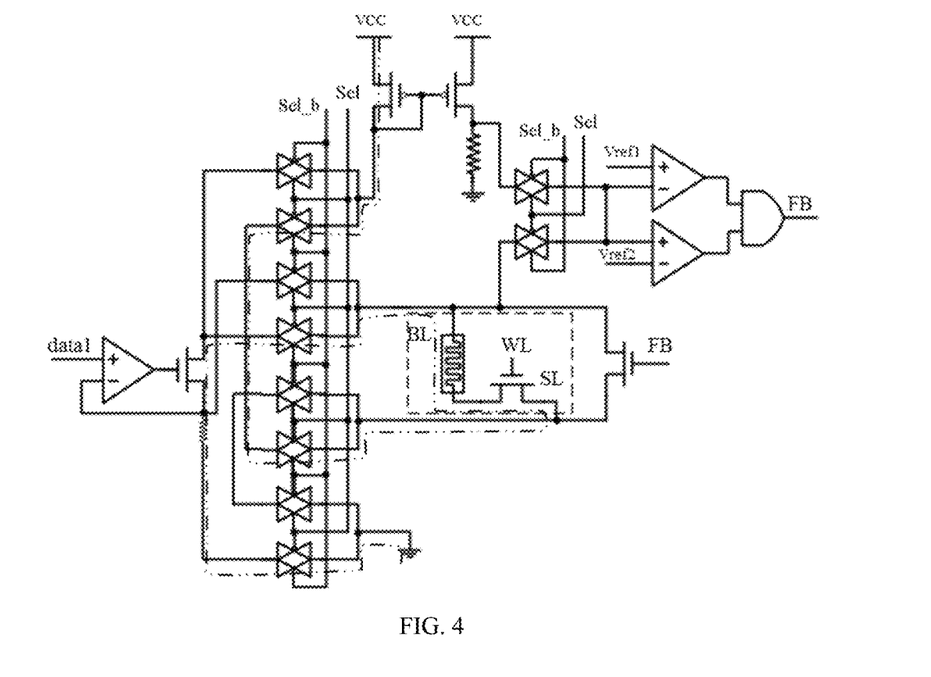
FIG. 4 shows a second path diagram of current programming of a memory circuit structure according to an embodiment of the present disclosure.
Figure 5:
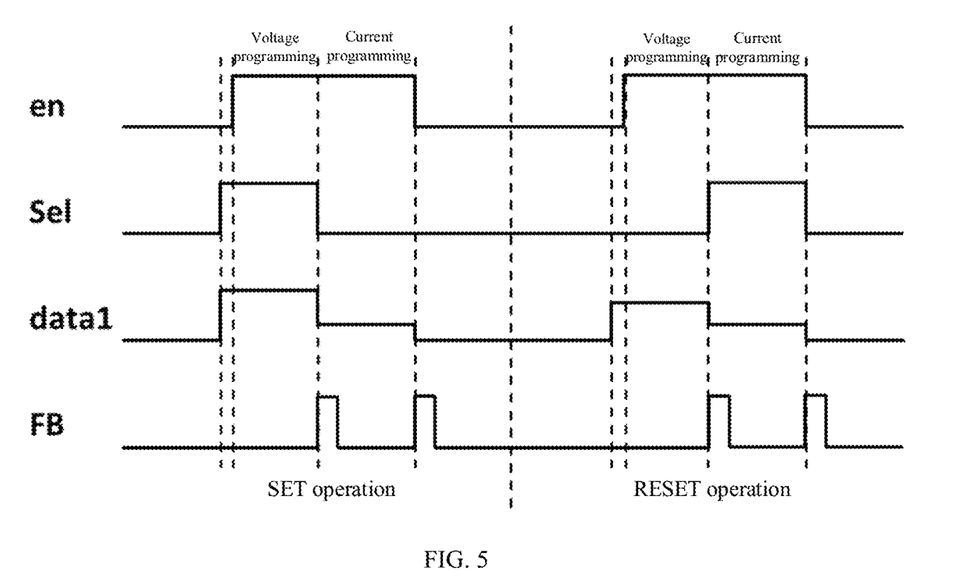
FIG. 5 shows a timing diagram illustrating an operation of a specific storage unit according to an embodiment of the present disclosure.

FIG. 3 shows a first path diagram of voltage programming of a memory circuit structure according to an embodiment of the present disclosure. FIG. 4 shows a second path diagram of current programming of a memory circuit structure according to an embodiment of the present disclosure. FIG. 5 shows a timing diagram illustrating an operation of a specific storage unit according to an embodiment of the present disclosure.

According to embodiments of the present disclosure, the data of Sel and data1 is configured before performing SET and RESET operations. En is equivalent to a gate control circuit, which is responsible for applying the configured data to the device. Every time FB changes from low level to high level, the circuit for device programming will change, and the programming mode will change accordingly.

According to embodiments of the present disclosure, as shown in FIG. 3 to FIG. 5, under the set or SET operation, Sel=1 and Sel_b=0, the programming circuit generates the voltage pulse, and the first path of the polarity switching circuit is turned on, so that the programming circuit may implement the voltage programming along the first path. The first path is shown by the single dotted line in FIG. 3. A path in which the first group of selection transistors is turned on being the first path is taken as an example. In this stage, the first programming data is written to the specific storage unit along the first path through the analog voltage signal data1. In a voltage programming stage, the detection circuit detects whether the first current flowing through the specific storage unit exceeds a first preset value. If the first current exceeds the first preset value, as shown in a first rectangular waveform of FB shown in FIG. 5, FB is high level and may correspond to logic "1" (if the first current is less than the first preset value, FB is low level and may correspond to logic "0", as shown in a horizontal line part in FIG. 5), the control unit controls the polarity switching circuit to switch from the first path to the second path, Sel 0 and Sel_b=1, so that the programming circuit outputs the constant current pulse to implement the current programming along the second path. The second path is shown by the double dotted line in FIG. 4, is exemplified by a path in which the second group of selection transistors is turned on. In this stage, the second programming data is written to the specific storage unit along the second path through the analog voltage signal data1. In a current programming stage, the detection circuit detects whether a first voltage ($V_{ref1}$) on the specific storage unit exceeds a second preset value (for example, a reference voltage $V_{ref2}$); If the first voltage exceeds the second preset value, then FB=logic "1", as shown in a second rectangular waveform of FB shown in FIG. 5, the control unit controls the programming circuit to stop output.

The preset value may be set according to the actual needs of the device. During a programming process, a small constant current pulse is introduced to make a certain current flow through the device to enhance a stability of a conductive path in the device after the device is programmed successfully. Without increasing a size of the conductive path, an oxygen vacancy concentration in the conductive path increases. Thus, the retention of RRAM may be improved.

According to embodiments of the present disclosure, as shown in FIG. 3 to FIG. 5, under the reset or RESET operation, Sel=0 and Sel_b=1, the programming circuit generates a constant current pulse, and a second path of the polarity switching circuit is turned on, so that the programming circuit may implement the current programming along the second path. The second path is shown by the double dotted line in FIG. 4, and is exemplified by the path in which the second group of selection transistors is turned on. In this stage, first erasing data is written to the specific storage unit along the second path through the analog voltage signal data1. In the current programming stage, the detection circuit detects whether a second voltage flowing through the specific storage unit is less than a third preset value. If the second voltage is less than the third preset value, as shown in a third rectangular waveform of FB shown in FIG. 5, FB=logic "1", the control unit controls the polarity switching circuit to switch from the second path to the first path, Sel=1 and Sel_b=0, so that the programming circuit outputs the voltage pulse to implement the voltage programming along the first path. The first path is shown by the single dotted line in FIG. 3. The path in which the first group of selection transistors is turned on being the first path is taken as an example. In this stage, second erasing data is written to the specific storage unit along the first path through the analog voltage signal data1. In the voltage programming stage, the detection circuit detects whether a second current on the specific storage unit is less than a fourth preset value. If the second current is less than the fourth preset value, then FB=logic "1", as shown in a fourth rectangular waveform of FB shown in FIG. 5, the control unit controls the programming circuit to stop output.

The preset value may be set according to the actual needs of the device. During the reset operation, instantaneous heating on an internal conductive channel of the device is implemented through a large current, so that an oxygen vacancy channel is broken. Since the breaking process of the conductive channel is very random, each breaking is different. After programming, a small voltage pulse is introduced to make the random oxygen vacancies more agglomerated after the conductive channel breaks, unnecessary discrete oxygen vacancies are minimized, so that the broken conductive channel is more stable.

According to embodiments of the present disclosure, as shown in FIG. 3 to FIG. 5, when the first selection signal (Sel_b) controls the first group of selection transistors to turn on, and the second selection signal (Sel) controls the second group of selection transistors to turn off, the first path of the polarity switching circuit is turned on, so that the programming circuit may implement the voltage programming along the first path. When the first selection signal controls the first group of selection transistors to turn off, and the second selection signal controls the second group of selection transistors to turn on, the second path of the polarity switching circuit is turned on, and the second path is different from the first path, so that the programming circuit implement the current programming along the second path.

Figure 6:
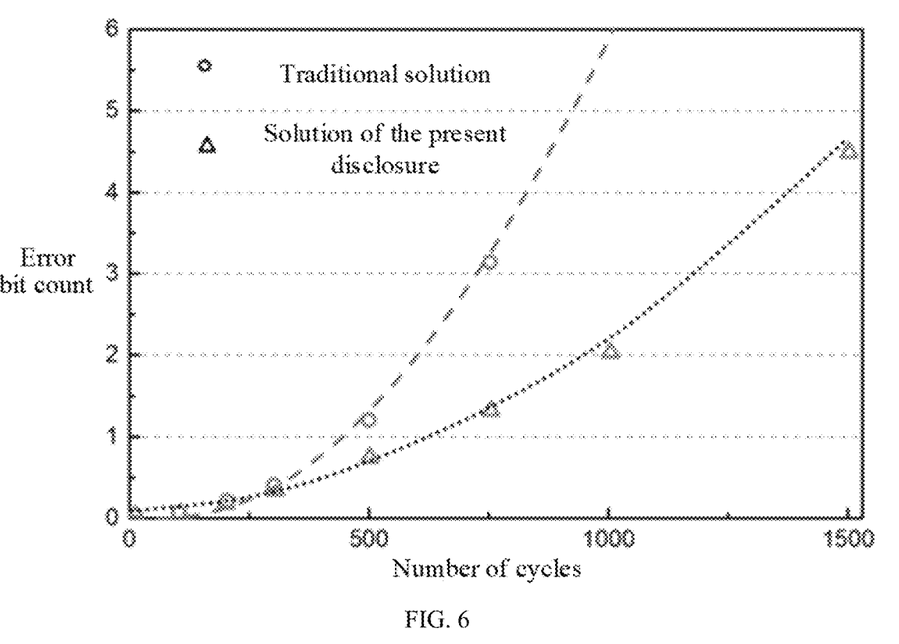
FIG. 6 shows a curve of the number of error bits of a memory circuit structure changing with the number of cycles according to an embodiment of the present disclosure.
Figure 7:
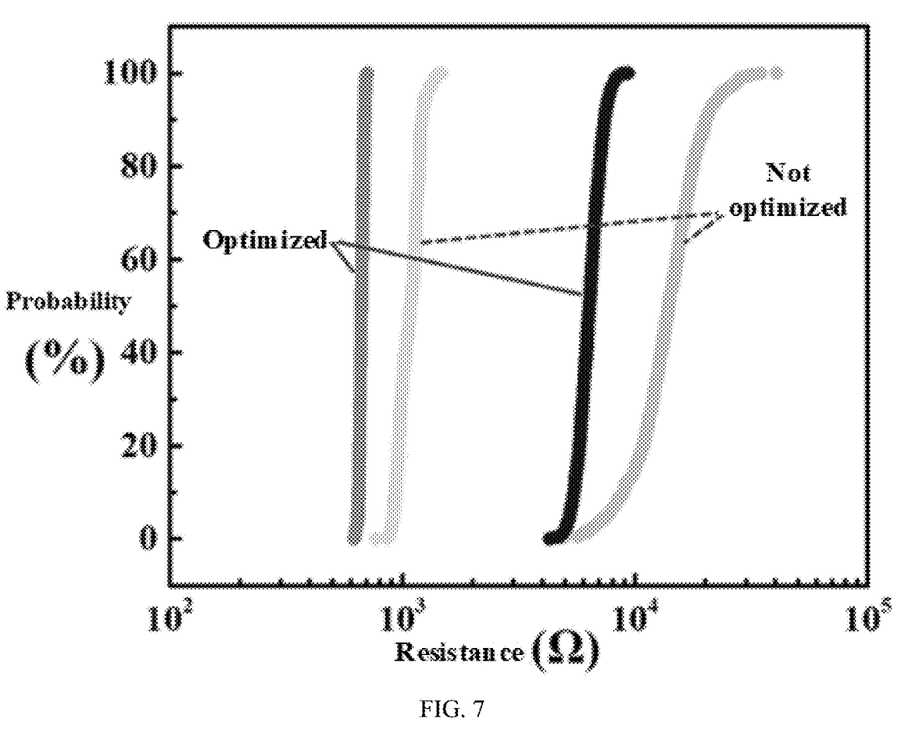
FIG. 7 shows a comparison diagram of resistance state distribution function curves of a memory circuit structure according to an embodiment of the present disclosure and a memory circuit of the related art.

FIG. 6 shows a curve of an error bit count of a memory circuit structure changing with the number of cycles according to an embodiment of the present disclosure. FIG. 7 shows a comparison diagram of resistance state distribution function curves of a memory circuit structure according to an embodiment of the present disclosure and a memory circuit of the prior art.

In FIG. 6, circles represent the changing data of error bit count and the number of cycles of erasing and writing the device under the traditional single-pulse operation solution, and triangles represent the changing data of error bit count and the number of cycles of erasing and writing the device under the circuit operation solution proposed in the present disclosure. The dotted line represents a change trend of the error bit count fitted with the number of cycles of erasing and writing the device under the two pulse operation solutions. As shown in FIG. 6, it is obvious that the circuit solution proposed in the present disclosure may make the same device operate more times in cycles under the same error bit count.

FIG. 7 shows a comparison of resistance state distribution functions of the traditional solution (not optimized) and the solution of the present disclosure (optimized). The traditional solution is a single voltage pulse operation. FIG. 7 shows a distribution probability of high resistance state and low resistance state obtained by cyclically operating the device under the two solutions. As shown in FIG. 7, the uniformity of the device resistance distribution obtained by the operation of the solution (optimized) of the present disclosure is better than that of the traditional solution (not optimized).

In a second exemplary embodiment of the present disclosure, there is provided a method of operating a memory circuit structure. The above-mentioned operation is a set operation or a reset operation.

The above-mentioned method includes following operations: S21 to S24.

In operation S21, under the set operation or the reset operation, a decoder selects a specific storage unit of a specific row and a specific column in a storage array for operation.

In operation S22, a detection circuit detects a detection signal of a current or a voltage corresponding to the specific storage unit in the storage array, and feeds back the detection signal to a control unit.

In operation S23, a controller controls, according to the detection signal, a polarity switching circuit to perform a switching operation and controls a pulse output of a programming circuit.

In operation S24, the programming circuit generates a voltage pulse or a constant current pulse under an action of the controller, and implements first voltage programming and then current programming under the set operation, or first current programming and then voltage programming under the reset operation under the switching operation of the polarity switching circuit.

When the above-mentioned method performs the set or reset operation on the storage array, the programming and erasing process of the entire storage array is optimized by using the circuit solution with two programming modes coordinated. The control unit may control, according to the detection signal of the detection unit, the polarity switching circuit to perform a switching operation and control the pulse output of the programming circuit, so that the programming circuit may implement a switching between the voltage programming and the current programming during the set or reset operation, so as to implement the coordinated work of the voltage programming and the constant current programming during the set or reset operation, so as to optimize the endurance and retention characteristics of the resistive memory, improve the uniformity of the resistive states, and reduce the bit error rate of the array. Therefore, the performance of the resistive memory may be effectively maintained in a plurality of read and write periods/cycles.

In summary, the present disclosure provides a memory circuit structure and a method of operating the same. When the set or reset operation is performed on the storage array, the control unit may control, according to the detection signal of the detection unit, the polarity switching circuit to perform a switching operation and control the pulse output of the programming circuit, so that the programming circuit may implement a switching between the voltage programming and the current programming during the set or reset operation, so as to implement the coordinated work of the voltage programming and the constant current programming during the set or reset operation. The programming and erasing process of the entire storage array is optimized by using the circuit solution with two programming modes coordinated, so as to optimize the endurance and retention characteristics of the resistive memory, improve the uniformity of the resistive states, and reduce the bit error rate of the array. Therefore, the performance of the resistive memory may be effectively maintained in a plurality of read and write periods/cycles.

It should also be noted that although the present disclosure has been described in combination with the accompanying drawings, the embodiments disclosed in the accompanying drawings are intended to illustrate the preferred embodiments of the present disclosure, and are not to be understood as limiting the present disclosure. The dimensional proportions in the accompanying drawings are only schematic and are not to be understood as limiting the present disclosure. Directional terms mentioned in the embodiments, such as "up", "down", "front", "back", "left", "right", etc., are only the directions referring to the accompanying drawings and are not intended to limit the scope of protection of the present disclosure. Throughout the accompanying drawings, the same elements are represented by the same or similar reference signs. Conventional structures or constructions will be omitted when they may obscure the understanding of the present disclosure.

In addition, shapes and sizes of the respective components in the figures do not reflect true sizes and proportions, but merely illustrate contents of embodiments of the present disclosure. Moreover, in the claims, any reference signs placed between parentheses should not be construed as limiting the claims.

The use of ordinal numbers such as "first", "second", "third", etc. in the specification and claims to modify a corresponding element do not mean that the element has any ordinal number, nor does it represent the ordering of one element relative to another element or the ordering of manufacturing methods. The use of such ordinal numbers is only used to clearly distinguish an element having a certain name and another element having the same name. Furthermore, the word "including" or "comprising" does not exclude the presence of elements or steps not listed in the claims. The word "a" or "an" preceding an element does not exclude the presence of a plurality of such elements.

Unless a technical obstacle or conflict exists, the various embodiments of the present disclosure described above may be freely combined to form further embodiments, which are all within the scope of protection of the present disclosure.

The specific embodiments described above further explain objectives, technical solutions and beneficial effects of the present disclosure in detail, and it should be understood that the specific embodiments described above are only specific embodiments of the present disclosure, and should not be used to limit the present disclosure, and any modifications, equivalent substitutions, improvements and the like made within the spirit and principle of the present disclosure should be included in the protection scope of the present disclosure.

What is claimed is:

1. A memory circuit structure, comprising:
   a storage array, wherein the storage array comprises at least two storage units;
   a decoder connected with a bit line and a word line of the storage array, and configured to select a specific storage unit in a specific row and a specific column for operation;
   a programming circuit configured to generate a voltage pulse or a constant current pulse;
   a polarity switching circuit connected with the programming circuit, and configured to implement a switching between a voltage programming and a current programming of the programming circuit under a set operation and a reset operation;
   a detection circuit connected with the storage array, and configured to detect a detection signal of a current or a voltage corresponding to the specific storage unit in the storage array and feed back the detection signal to a control unit, wherein the detection signal output by the detection circuit is configured to enable the polarity switching circuit to switch; and
   the control unit configured to, according to the detection signal, control the polarity switching circuit to perform a switching operation and control a pulse output of the programming circuit.

2. The memory circuit structure according to claim 1, wherein,
   under the set operation, the programming circuit is configured to generate the voltage pulse, and a first path of the polarity switching circuit is turned on, so that the programming circuit implements the voltage programming along the first path;
   in a voltage programming stage, the detection circuit is configured to detect whether a first current flowing through the specific storage unit exceeds a first preset value;
   the control unit is configured to control the polarity switching circuit to switch from the first path to a second path, and cause the programming circuit to output the constant current pulse to implement the current programming along the second path, in response to the first current exceeding the first preset value;
   in a current programming stage, the detection circuit is configured to detect whether a first voltage on the specific storage unit exceeds a second preset value; and
   the control unit is configured to control the programming circuit to stop output in response to the first voltage exceeding the second preset value.

3. The memory circuit structure according to claim 1, wherein,
   under the reset operation, the programming circuit is configured to generate the constant current pulse, and a second path of the polarity switching circuit is turned on, so that the programming circuit implements the current programming along the second path;
   in a current programming stage, the detection circuit is configured to detect whether a second voltage flowing through the specific storage unit is less than a third preset value;
   the control unit is configured to control the polarity switching circuit to switch from the second path to a first path, and cause the programming circuit to output the voltage pulse to implement the voltage programming along the first path, in response to the second voltage falling below the third preset value;
   in a voltage programming stage, the detection circuit is configured to detect whether a second current on the specific storage unit is less than a fourth preset value; and
   the control unit is configured to control the programming circuit to stop output, in response to the second current falling below the fourth preset value.

4. The memory circuit structure according to claim 1, wherein the polarity switching circuit comprises two groups of selection transistors in parallel; each group of selection transistors comprises at least two selection transistors in series; the two groups of selection transistors are respectively a first group of selection transistors and a second group of selection transistors; an on-off of the first group of selection transistors is controlled by a first selection signal output by the control unit; and an on-off of the second group of selection transistors is controlled by a second selection signal output by the control unit; wherein the first selection signal is configured to control the first group of selection transistors to turn on while the second selection signal is configured to control the second group of selection transistors to turn off, or the first selection signal is configured to control the first group of selection transistors to turn off while the second selection signal is configured to control the second group of selection transistors to turn on.

5. The memory circuit structure according to claim 4, wherein,
   when the first selection signal (Sel_b) is configured to control the first group of selection transistors to turn on and the second selection signal (Sel) is configured to control the second group of selection transistors to turn off, a first path of the polarity switching circuit is turned on, so that the programming circuit implements the voltage programming along the first path; and when the first selection signal is configured to control the first group of selection transistors to turn off and the second selection signal is configured to control the second group of selection transistors to turn on, a second path of the polarity switching circuit is turned on, and the second path is different from the first path, so that the programming circuit implements the current programming along the second path.

6. The memory circuit structure according to claim 1, wherein the detection circuit comprises:
   a first transistor, wherein an on-off of the first transistor is controlled by a first selection signal output by the control unit, and one end of the first transistor is used as an input end of the detection circuit;
   a first comparator, wherein a negative input end of the first comparator is connected with another end of the first transistor, and a positive input end of the first comparator is configured to input the detection signal of the voltage corresponding to the specific storage unit;
   a second transistor, wherein an on-off of the second transistor is controlled by a second selection signal output by the control unit, and one end of the second transistor is connected with the storage array;
   a second comparator, wherein an positive input end of the second comparator is connected with the other end of the second transistor, a negative input end of the second comparator is configured to input a reference voltage, and the negative input end of the first comparator is connected with the positive input end of the second comparator; and
   a logic gate, wherein two input ends of the logic gate are respectively connected with an output end of the first comparator and an output end of the second comparator, and an output of the logic gate is the detection signal.

7. The memory circuit structure according to claim 6, further comprising:
   a current supply and management circuit, wherein the current supply and management circuit comprises a current mirror circuit, and the current mirror circuit comprises two output ends,
   wherein one of the two output ends of the current mirror circuit is connected with an input end of the polarity switching circuit, and the other one of the two output ends of the current mirror circuit is connected with the input end of the detection circuit.

8. The memory circuit structure according to claim 1, further comprising:
   a bias circuit connected with the programming circuit,
   wherein the control unit is configured to output an enabling signal to cause the bias circuit generate an analog voltage signal, and the analog voltage signal is output to the programming circuit.

9. The memory circuit structure according to claim 1, wherein the storage unit is a resistive memory.

10. A method of operating the memory circuit structure according to claim 1, wherein the operation is a set operation or a reset operation, and the method comprises:
    selecting, by a decoder, a specific storage unit in a specific row and a specific column of a storage array for operation, under the set operation or the reset operation;
    detecting, by a detection circuit, a detection signal of a current or a voltage corresponding to the specific storage unit in the storage array, and feeding back, by the detection circuit, the detection signal to a control unit;
    controlling, by a controller, a polarity switching circuit to perform a switching operation and a pulse output of a programming circuit according to the detection signal; and
    generating, by the programming circuit, a voltage pulse or a constant current pulse under an action of the controller, and implementing, by the programming circuit, first voltage programming and then current programming under the set operation or first current programming and then voltage programming under the reset operation, under the switching operation of the polarity switching circuit.

* * * * *